(12) United States Patent
Paul et al.

(10) Patent No.: US 8,324,973 B2
(45) Date of Patent: Dec. 4, 2012

(54) LOW OUTPUT IMPEDANCE RF AMPLIFIER

(75) Inventors: Susanne Paul, Austin, TX (US); Marius Goldenberg, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 1 day.

(21) Appl. No.: 12/633,312

(22) Filed: Dec. 8, 2009

(65) Prior Publication Data

US 2011/0133838 A1 Jun. 9, 2011

(51) Int. Cl.
*H03F 3/191* (2006.01)
*H03F 3/45* (2006.01)

(52) U.S. Cl. .................... 330/302; 330/253; 330/310

(58) Field of Classification Search .................. 330/253, 330/283, 302, 310, 277
See application file for complete search history.

(56) References Cited

U.S. PATENT DOCUMENTS

| | | | |
|---|---|---|---|
| 4,096,443 A | 6/1978 | Gilson | |
| 6,549,071 B1 * | 4/2003 | Paul et al. | 330/277 |
| 7,439,805 B1 | 10/2008 | Kobayashi | |
| 7,508,264 B1 * | 3/2009 | Terrovitis | 330/253 |
| 2006/0208799 A1 | 9/2006 | Paul et al. | |

FOREIGN PATENT DOCUMENTS

EP 0975089 A2 1/2000

OTHER PUBLICATIONS

International Search Report and Written Opinion mailed Mar. 16, 2011 in PCT/US2010/059488, 11 pages.
Gee, Wesley A. et al. "CMOS Integrated LC RF Bandpass Filter with Transformer-Coupled Q-Enhancement and Optimized Linearity," IEEE International Symposium on Circuits and Systems, 2007 (ISCAS 2007), May 1, 2007, pp. 1445-1448.

* cited by examiner

*Primary Examiner* — Khanh V Nguyen
(74) *Attorney, Agent, or Firm* — Zagorin O'Brien Graham LLP

(57) ABSTRACT

A radio frequency (RF) power amplifier includes a low impedance pre-driver driving the input of a common-source output amplifier stage. The preamplifier includes a first transistor that has a first terminal coupled to a preamplifier RF input node, a second terminal coupled to a preamplifier RF output node, and a third terminal coupled to a supply voltage node. A first inductor is coupled between the RF output node and a bias voltage node. A voltage difference between respective first and second voltages on the RF input node and the RF output node that are substantially in phase, determines current through the first transistor.

32 Claims, 12 Drawing Sheets

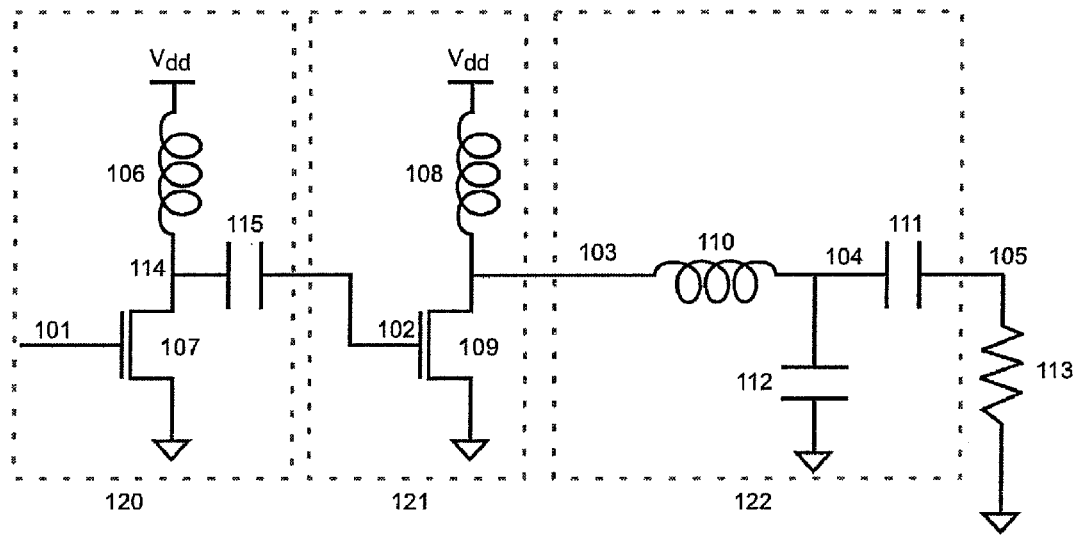
Figure 1a.     (Prior Art)
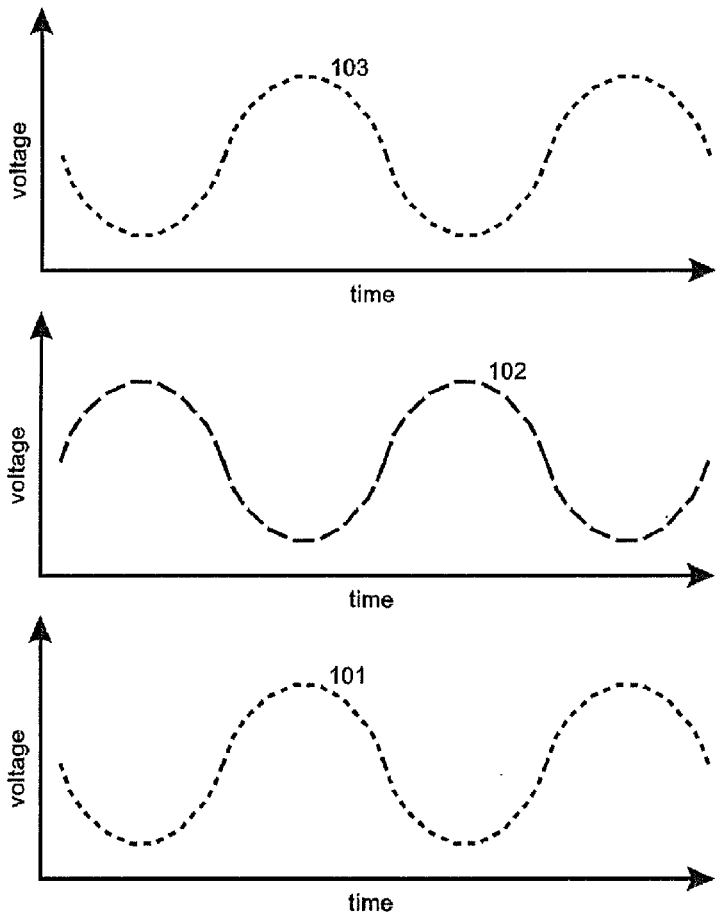
Figure 1b.     (Prior Art)

LOW OUTPUT IMPEDANCE RF AMPLIFIER

BACKGROUND

1. Field of the Invention

This invention relates to a multiple stage radio frequency (RF) power amplifier (PA) and more particularly to a low output impedance RF amplifier associated therewith.

2. Description of the Related Art

Hardware implementations of almost all wireless communication and control systems, employing almost all possible RF modulation techniques, include RF power amplifiers (PAs) as a necessary component. Examples of RF modulation techniques include, but are not limited to, GMSK, 8PSK, 16-QAM, 64-QAM, where the amplitude of the RF signal may always be constant or may take any value in a continuous or discrete range. Examples of such systems include, but are not limited to, cellular GSM, CDMA, W-CDMA voice and data terminals, Wi-Fi, Bluetooth, remote controls, RFID readers.

RF power amplifiers for wireless applications, such as cellular, must produce high gain and high output power levels. In a typical RF transmitter, the output power and gain requirements of the PA are met by employing multiple cascaded stages of amplification, where each stage may utilize one or more active devices such as silicon MOSFETs and BJTs, GaAs MESFETs, and HBTs.

FIG. 1a shows an example of a multi-stage PA known in the art. Significant design trade-offs are encountered in the implementation of prior art multi-stage PAs. Although FIG. 1a depicts the use of NMOSFET devices as active elements, it should be apparent to those of skill in the art that other active devices, such as other types of FETs or BJTs, could be used instead. The PA shown in FIG. 1a has two gain stages, 120 and 121, followed by the matching network 122. The output node 105 is coupled to the load, symbolically presented as resistor 113, typically 50 ohm. The matching network 122 plays the role of an impedance transformation network, which converts the relatively high load impedance of 50 ohm into a lower impedance (e.g. 5 ohm) as seen by the output 103 of the final PA stage 121. The lower impedance limits the maximum voltage swing present at node 103 necessary for injecting the needed maximum output power into the load 113. The matching network exemplified in FIG. 1a consists of the inductor 110 and capacitor 112, which, together with the output stage load inductor 108, form a tuned transformation circuit. Capacitor 111 blocks the DC voltage present at the matching network output node 104 from reaching the load 113.

The PA output amplifier stage 121 consists of the active device, MOSFET 109, connected in a common-source configuration, and the load inductor 108, connected between the output node 103 and the power supply Vdd. The current through transistor 109 is controlled by the voltage difference between the gate terminal, connected to the stage input node 102, and the source terminal, connected to ground. The drain of transistor 109 is connected to the stage output node 103. The voltage signal at the drain node is substantially in phase opposition to the voltage signal on the gate node as a direct consequence of the common-source configuration of transistor 109. Inductor 108 plays two roles: it supplies the DC power to the active device 109 and it completes the resonant transformation network in conjunction with block 122. The output amplifier stage 121 receives its input on node 102 from the preamplifier stage 120 by means of the AC coupling capacitor 115.

The preamplifier stage 120 consists of the active device, MOSFET 107, connected in a common-source configuration, and the load inductor 106, connected between the output node 114 and the power supply Vdd. The current through transistor 107 is controlled by the voltage difference between the gate terminal, connected to the stage input node 101, and the source terminal, connected to ground. The drain of transistor 107 is connected to the stage output node 114. The voltage signal at the drain node is substantially in phase opposition to the voltage signal on the gate node as a direct consequence of the common-source configuration of transistor 107. Inductor 106 plays two roles: it supplies the DC power to the active device 107 and it completes the parallel resonant tank circuit in conjunction with the input capacitance presented by block 121. In the particular circuit presented in FIG. 1a, the AC coupling capacitor 115 isolates the DC potential present at node 114 from the DC potential appropriate for the bias of the control terminal of transistor 109. In other embodiments, as a result of judiciously chosen supply voltages, capacitor 115 is eliminated and nodes 114 and 102 share the same potential. The preamplifier stage 120 receives its input on node 101.

The operation of the PA presented in FIG. 1a is qualitatively illustrated by the waveforms in FIG. 1b. The preamplifier stage 120 receives on node 101 the sinusoidal voltage waveform shown in the bottom graph. As a result, the preamplifier output node 114, and similarly the input node 102 of the amplifier stage 121, will present a voltage waveform substantially in phase opposition to the waveform on node 101, exemplified in the middle graph of FIG. 1b. Likewise, the amplifier stage 121 generates a voltage waveform at its output node 103, which is substantially in phase opposition to the waveform on node 102, exemplified in the top graph of FIG. 1b.

Since the output amplifier 121 sees a low load impedance at node 103, the maximum current flowing through the active device 109 is large. Therefore, the active device physical size is large. A dominant non-ideality for active devices is parasitic capacitance between its terminals. Owing to its large size, device 109 presents significant capacitances between node 103 and ground, between node 102 and ground, as well as between node 103 and node 102.

The active device parasitic capacitance between node 103 and ground can be considered as embedded in the resonant transformation network and does not significantly increase the difficulty of the trade-offs involved in the design of the PA.

The active device parasitic capacitance between node 102 and ground presents a substantial capacitive load to the preamplifier. This capacitance needs to be effectively resonated out by the preamplifier's output inductor 106 or else the gain of the preamplifier would collapse to an unacceptable value. The large value of the capacitive load to the preamplifier stage poses significant design constraints on the realizable gain of the preamplifier due to the limited quality factor Q of inductor 106.

Most significantly, the active device parasitic capacitance between node 103 and node 102 opens a feedback path between the output and the input of the output amplifier 121, greatly increasing the chance of circuit instability. The circuit networks located at both the output and at the input of amplifier 121 are tuned resonant circuits, likely tuned on the same RF frequency. For signal frequencies below resonance, both the input and the output circuits present inductive impedances, which, in conjunction with the parasitic capacitance between node 103 and node 102, and the active device 109, form the structure of the Hartley sinusoidal oscillator depicted in FIG. 2.

In reference to FIG. 2, the active device 201 corresponds to device 109 in FIG. 1a. Inductor 202 corresponds to the inductive impedance presented at node 102 by the combination of inductor 106 and parasitic capacitance between node 102 and ground, when operated at a frequency below resonance. Inductor 203 corresponds to the inductive impedance presented at node 103 by the combination of inductor 108, parasitic capacitance between node 103 and ground, and matching network 122, when operated at a frequency below resonance. Capacitor 204 corresponds to the parasitic capacitance between node 103 and node 102.

The presence of a Hartley oscillator structure in the output amplifier of the PA introduces significant design constraints due to the trade-offs involved in guaranteeing that the negative impedance created by the capacitive feedback in conjunction with an inductive load does not overcome the resistive loss in the input circuit. In reference to FIG. 1a, the loss in the input circuit is dominated by the quality factor of inductor 106. As a consequence of the common-source (common-emitter) configuration, the preamplifier active device 107 contributes very little to the resistive loss. In order to insure that the condition of oscillation is not met, one or more of the following design parameters have to be traded-off. One trade-off involves reducing the quality factor Q of inductor 106. That may however, severely limit the achievable gain in the preamplifier stage 120. Another parameter involves reduction of the transconductance gain, Gm, of the output amplifier active device 109. That reduction limits the achievable gain of the output amplifier 121, and increases the maximum swing of the input node 102, significantly affecting the linearity of the PA.

A further design constraint introduced by the feedback path created by the active device parasitic capacitance between node 103 and node 102 is the resistive load reflected between the input node 102 and ground at the frequency of interest. Ideally, if the feedback parasitic capacitance were absent, the impedance presented at node 102 by the active device 109 would be purely capacitive. However, the large feedback capacitance will present a fraction of the active device's transconductance at node 102, effectively adding an additional resistive load to the preamplifier stage 120. Due to the nature of the common-source (or common-emitter) configuration of stage 120, any additional resistive load will directly convert into a proportional gain degradation. Since device 109 is a large transconductance device, the gain degradation of the preamplifier can be significant.

An approach known in the art to mitigate some of the constraints listed above inserts a matching network between the preamplifier stage 120 and the output amplifier 121. Such an interstage matching network presents a low impedance towards the input of stage 121, while maintaining a large load impedance for the preamplifier stage 120. The specific case exemplified in FIG. 1a where the AC coupling capacitor 115 is present as the link between the preamplifier stage 120 and the output amplifier 121 can be designed such that the combination of inductor 106, capacitor 115, and the parasitic capacitance between node 102 and ground form an impedance transformation matching network. FIG. 3 shows in detail the structure of the interstage matching network present in FIG. 1a. The matching network input node 301 corresponds to the preamplifier output node 114. The matching network output node 302 corresponds to the final amplifier stage input node 102. Inductor 303 and capacitor 304 correspond to inductor 106 and capacitor 115, respectively. Capacitor 305 corresponds to the equivalent capacitance seen between node 102 and ground towards the input of the final amplifier stage 121. The resonant LC structure presented in FIG. 3 is easily recognized by one skilled in the art as an impedance down-converter matching network. The ratio of the output impedance, Z302, to the input impedance, Z301, is less than 1. The output impedance, Z302, is proportional to the size of capacitor 304. If capacitor 304 is much larger than capacitor 305, then the circuit in FIG. 3 does not perform any impedance transformation. If capacitor 304 has a value similar or smaller than capacitor 305, then the circuit in FIG. 3 will create an output impedance smaller than the impedance attached to its input. The drawback of this solution is the fact that the impedance down-transformation is achieved at the cost of significant reduction in voltage swing at the input of stage 121. As a consequence, gains have to be boosted in the preamplifier and/or the output amplifier of the PA, a costly proposition.

FIG. 4a shows another example of a multistage PA where both the output amplifier stage 421 and the preamplifier stage 420 are built using MOSFET devices connected in the common-source configuration. The load 419, usually 50 ohm, is connected through the DC blocking capacitor 418 to the matching network 422 comprising capacitors 417 and 415, and the inductor 416. The output amplifier stage 421 consists of complimentary MOSFET devices, the NMOS 413 and the PMOS 412, and inductor 414 connected between node 405, and node 406. The current through transistor 413 is controlled by the voltage difference between the gate terminal, connected to the stage input node 404, and the source terminal, connected to ground. The drain of transistor 413 is connected to the stage output node 406. The voltage signal at the drain node is substantially in phase opposition to the voltage signal on the gate node as a direct consequence of the common-source configuration of transistor 413. Similarly, the current through transistor 412 is controlled by the voltage difference between the gate terminal, connected to the stage input node 403, and the source terminal, connected to Vdd. The drain of transistor 412 is connected to the stage output node 405. The voltage signal at the drain node is substantially in phase opposition to the voltage signal on the gate node as a direct consequence of the common-source configuration of transistor 412. Inductor 414 plays two roles: it allows current to flow between the NMOS and the PMOS devices so that both devices share bias current, and it completes the resonant transformation network in conjunction with block 422.

The matching network 422, in conjunction with the inductor 414, forms a lumped balun structure which simultaneously achieves differential to single-ended conversion as well as impedance transformation. FIG. 4b qualitatively illustrates the voltage waveforms present at the nodes of the PA shown in FIG. 4a. The signals at nodes 405 and 406 are in phase opposition as depicted in FIG. 4b top graph. The signals at nodes 403 and 404 (FIG. 4b middle graph) are also in phase opposition and are supplied by the preamplifier stage 420. It is observable in FIG. 4b that the voltage waveforms of the homologous outputs and inputs nodes of the amplifier stage 421 are substantially in phase opposition—e.g. nodes 406 and 404.

The preamplifier stage 420 consists of complimentary MOSFET devices, NMOS 410, PMOS 409, and inductor 411 connected between nodes 404 and 403. The current through transistor 410 is controlled by the voltage difference between the gate terminal, connected to the stage input node 402, and the source terminal, connected to ground. The drain of transistor 410 is connected to the stage output node 404. The voltage signal at the drain node is substantially in phase opposition to the voltage signal on the gate node as a direct consequence of the common-source configuration of transistor 410. Similarly, the current through transistor 409 is controlled by the voltage difference between the gate terminal, connected to the stage input node 401, and the source terminal, connected to Vdd. The drain of transistor 409 is connected to the stage output node 403. The voltage signal at the drain node is substantially in phase opposition to the voltage signal on the gate node as a direct consequence of the common-source configuration of transistor 409. Inductor 411 plays two roles: it allows current to flow between the NMOS and the PMOS devices achieving current sharing between both devices, and it cancels the capacitive reactance reflected at the input of the amplifier stage 421 at the resonant frequency. Analogous to stage 421, the signals at nodes 401 and 402 are in phase opposition as depicted in FIG. 4b bottom graph, while the voltage waveforms of the homologous outputs and input nodes of the amplifier stage 420 are substantially in phase opposition—e.g. nodes 404 and 402—as shown in FIG. 4b middle and bottom graphs.

Although the PA shown in FIG. 4 consists of complementary MOS amplifier stages, each having two inputs and two outputs, its behavior and hence, its design constraints and trade-offs, are substantially similar to those described in reference to FIG. 1. This can be easily understood by one skilled in the art, by assuming the presence of virtual grounds at middle points of inductors 411 and 414. In such a case, the amplifier stages in FIG. 4 simply look like two copies, a PMOS version and an NMOS version, of the amplifier stages of FIG. 1, stacked one above the other. As a result, this amplifier has similar stability concerns as the amplifier of FIG. 1.

Transistor 413 harbors a significant parasitic capacitance between the gate node 404 and the drain node 406. The impedance presented towards the drain node 406 by the matching network 422 in conjunction with inductor 414 is substantially equivalent to one characteristic of a resonant LC tank. At the same time, the combination of the parasitic capacitance between node 404 and ground, and a portion of inductor 411 form a resonant LC tank at the gate of device 413. The tuning frequencies of the two tanks thus formed need to be substantially similar in order to achieve an acceptable PA gain. For signal frequencies below the resonant frequency, both the drain equivalent LC tank and the gate LC tank will present an inductive impedance, which, in combination with the capacitance between nodes 404 and 406 and transistor 413, form the structure of a Hartley oscillator.

Likewise, transistor 412 harbors a significant parasitic capacitance between the gate node 403 and the drain node 405. The impedance presented towards the drain node 405 by the matching network 422 in conjunction with inductor 414 is substantially equivalent to one characteristic of a resonant LC tank. At the same time, the combination of the parasitic capacitance between node 403 and Vdd, and a portion of inductor 411 form a resonant LC tank at the gate of device 412. The tuning frequencies of the two tanks thus formed need to be substantially similar in order to achieve an acceptable PA gain. For signal frequencies below the resonant frequency, both the drain equivalent LC tank and the gate LC tank will present an inductive impedance, which, in combination with the capacitance between nodes 403 and 405 and transistor 412, form the structure of a Hartley oscillator.

As explained above, the PA illustrated in FIG. 4a embeds two Hartley oscillator structures. The oscillators are strongly coupled through the various shared components. However, the phase opposition relationship between the PFET side nodes (401, 403, 405) and the NFET side nodes (402, 404, 406) is not enforced in a free-running oscillation condition. Hence, two modes of oscillations are possible: a differential-mode oscillation, where the PFET side nodes and the NFET side nodes are substantially in phase opposition, and a common-mode oscillation, where the PFET side nodes and the NFET side nodes are substantially in phase. The two modes may appear independently or simultaneously in a given PA with the structure presented in FIG. 4a, depending on whether the condition of oscillation is met in either of the two modes. Additionally, the two modes of oscillation will likely have different oscillation frequencies. Ensuring that the condition of oscillation is not met with sufficient margin for both modes of oscillation introduces significant design constraints in the development of a PA such as the one in FIG. 4a.

SUMMARY

Embodiments of the present invention avoid the above-mentioned disadvantages of the prior art by removing the oscillatory condition that is otherwise created when the input of a common-source RF amplifier stage is resonated with a parallel inductor. This is done by providing a low impedance amplifier to drive the input of the common-source stage.

Accordingly, in one embodiment an apparatus is provided that includes a low impedance radio frequency (RF) amplifier. The low impedance amplifier includes a first transistor that has a first terminal coupled to the amplifier RF input node, a second terminal coupled to the amplifier RF output node, and a third terminal coupled to a supply voltage node. A first inductor is coupled between the RF output node and a bias voltage node. Current through the first transistor is determined predominantly by the voltage difference between the RF input node and the RF output node. The first inductor resonates with reactance present on the RF output node to increase the load impedance seen by the first transistor over a narrow frequency range. In an embodiment a second amplifier stage is coupled to the low impedance amplifier's RF output node. In an embodiment the second amplifier stage is a common-source amplifier. In an embodiment the voltages on the RF input node and the RF output node are substantially in phase.

In another embodiment, an apparatus is provided that includes a differential low impedance RF amplifier. The differential low impedance amplifier includes a positive transistor that has a first terminal coupled to the amplifier positive RF input node, a second terminal coupled to the amplifier positive RF output node, and a third terminal coupled to a positive supply voltage node. Also included is a negative transistor with a first terminal coupled to the amplifier negative RF input node, a second terminal coupled to the amplifier negative RF output node, and a third terminal coupled to a negative supply voltage node. A positive inductor is coupled between the positive RF output node and a positive bias voltage node. A negative inductor is coupled between the negative RF output node and a negative bias voltage node. Current through the positive transistor is determined predominantly by the voltage difference between the positive RF input node and the positive RF output node. Current through the negative transistor is determined predominantly by the voltage difference between the negative RF input node and the negative RF output node. The positive inductor resonates with reactance present on the positive RF output node to increase the load impedance seen by the positive transistor at RF over a narrow frequency range. The negative inductor resonates with reactance present on the negative RF output node to increase the load impedance seen by the negative transistor at RF over a narrow frequency range.

BRIEF DESCRIPTION OF THE DRAWINGS

The present invention may be better understood, and its numerous objects, features, and advantages made apparent to those skilled in the art by referencing the accompanying drawings.

FIG. 1a illustrates an example of a multi-stage PA known in the art.

FIG. 1b shows waveforms illustrating the operation of the PA presented in FIG. 1a.

FIG. 3 illustrates the structure of the interstage matching network associated with FIG. 1a.

FIG. 4b illustrates the voltage waveforms present at the nodes of the PA shown in FIG. 4a.

FIG. 5b illustrates waveforms associated with the embodiment of FIG. 5a.

FIG. 6b illustrates waveforms associated with the embodiment of FIG. 6a.

FIG. 7b illustrates waveforms corresponding to the embodiment shown in FIG. 7a.

The use of the same reference symbols in different drawings indicates similar or identical items.

DESCRIPTION OF THE PREFERRED EMBODIMENT(S)

Figure 2:
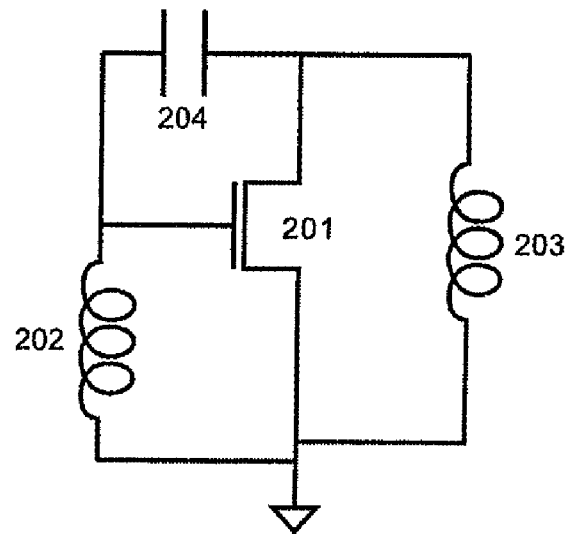
FIG. 2 shows the structure of a Hartley sinusoidal oscillator.
Figure 3:
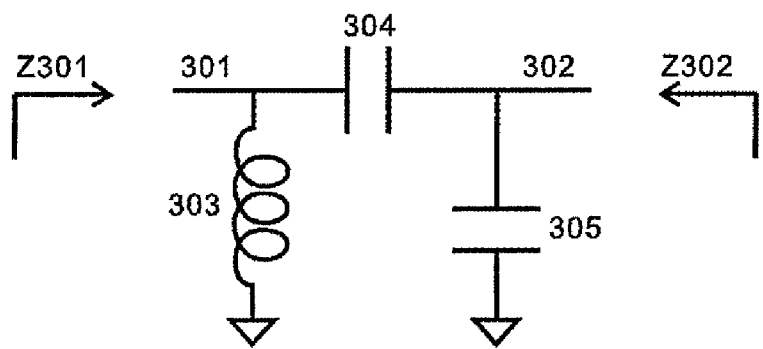
Figure 4A:
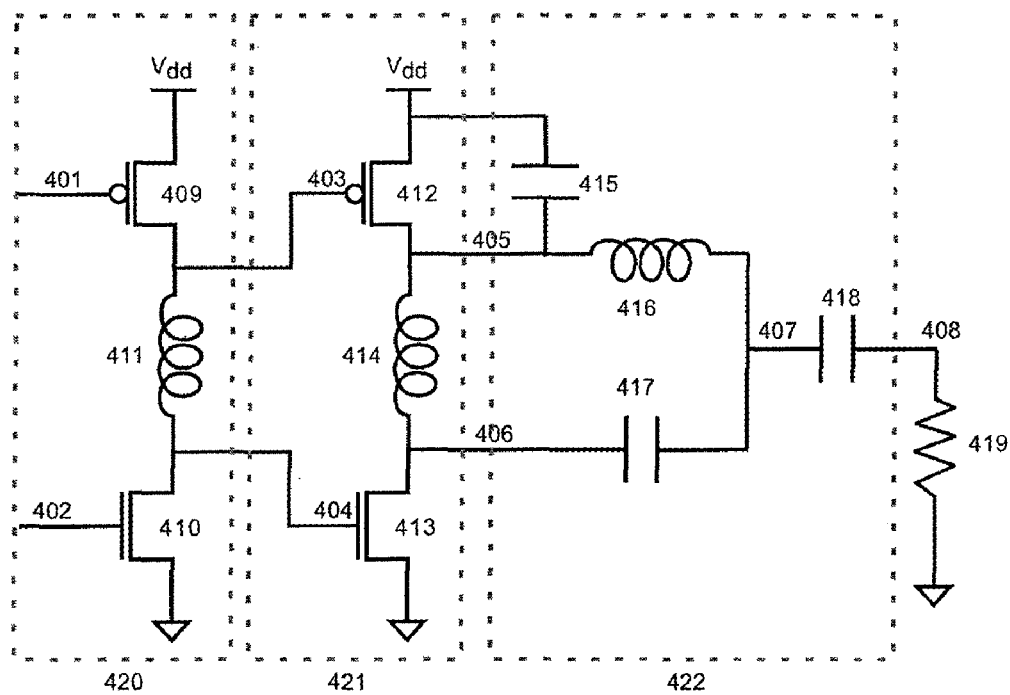
FIG. 4a shows another example of a multi-stage PA connected in a common-source configuration.
Figure 4B:
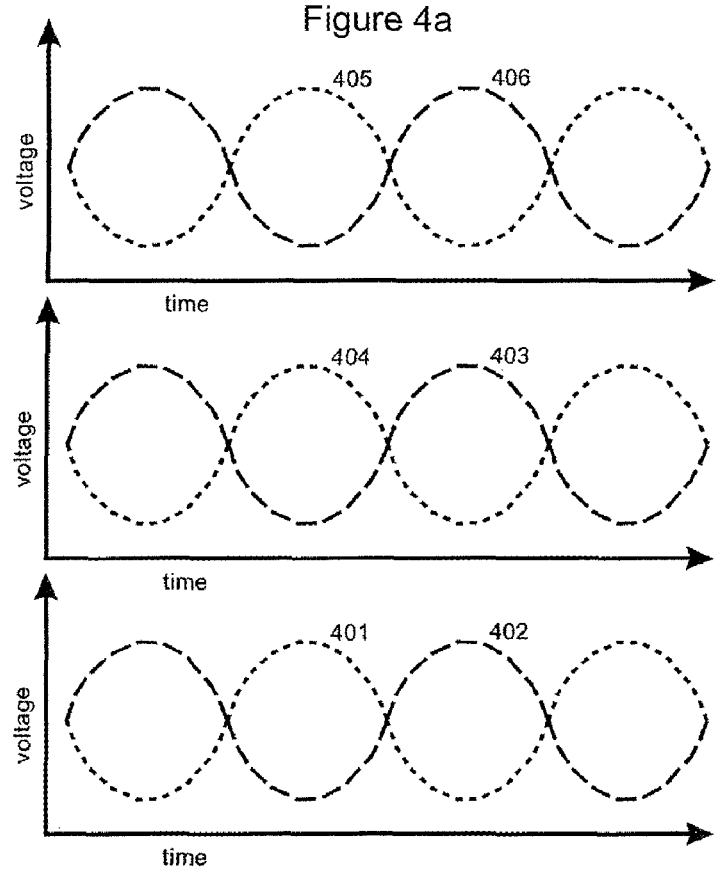
Figure 5A:
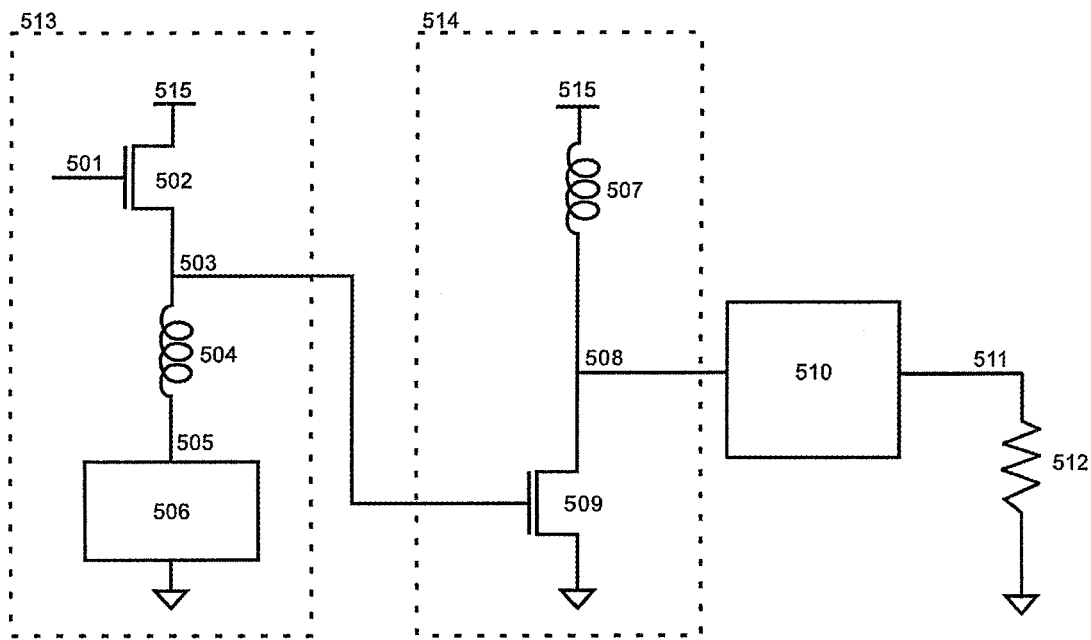
FIG. 5a illustrates a single ended embodiment of the present invention, configured as a predriver.

FIG. 5a shows one embodiment of the present invention, where it is utilized as a low impedance predriver for driving the input of a common-source amplifier stage. The system shown in FIG. 5a includes a load, 512, preceded by an output network, 510, preceded by an output amplifier stage, 514, preceded by an amplifier stage, 513, according to one embodiment of the present invention.

The load, 512, is shown symbolically as a resistor but could be any element that receives the power amplifier's output signal. The output network, 510, could be any power amplifier output network, including but not limited to passive LC impedance transformation networks, transformer-based output networks, transmission line networks, power combiners, or tunable passive networks. The output amplifier stage, 514, includes any RF power amplifier stage with a tuned output tank. The embodiment in FIG. 5 shows an example of such a power amplifier stage that is commonly used by those skilled in the field. It is a common-source amplifier formed from transistor 509 and inductor 507. Although transistor 509 is shown in the figure as an NMOS device, a variety of other suitable active devices could be used for it as well.

The preamplifier stage, 513, utilizes a low impedance amplifier embodiment of the present invention. It includes transistor 502, inductor 504, and bias block 506. The RF input to amplifier 513 is on node 501. The RF output from amplifier 513 is on node 503 and is connected to the input of the following amplifier stage, 514, and to inductor 504. Transistor 502 is shown as an NMOS transistor but could be any type of active element including but not limited to a PMOS transistor, a bipolar transistor, an HBT, or a MESFET. The connection of device 502 as shown provides a low impedance looking up into the source of transistor 502. In other words, the output impedance of transistor 502 at RF is low compared to the impedance at RF from node 503 to RF ground due to other elements connected to node 503. The low impedance provided by the present invention dampens any potential oscillatory conditions associated with device 509 and the reactive tanks connected to its gate and drain. Consequently the present invention, when used as an RF preamplifier, provides the advantage of improved stability compared to prior art common-source preamplifier stages.

It is desirable to make the RF voltage gain of amplifier 513 as close to unity as possible. This can be accomplished if the load impedance seen by transistor 502 is high at RF frequencies. However, the capacitance connected to node 503, both from parasitics within amplifier 513 and from elements within amplifier 514, is generally large and presents a low impedance at RF frequencies. Higher load impedance is achieved at RF frequencies by allowing the inductance on node 503 to resonate with the capacitance on node 503 at RF frequencies. The resonance between inductor 504 and the load connected to inductor 504 occurs at RF over a narrow frequency range. In other words, the resonance occurs over a frequency range that is small compared to the signal's carrier frequency and does not occur at DC or at baseband frequencies. In general, the reactance attached to node 503 may not be purely capacitive. It may include a combination of reactive elements. But the present invention is most effective when the total combined impedance attached to node 503 is capacitive. Since the reactive elements that form this resonant network have parasitic losses, there may also be some real component to the impedance.

Bias block 506 is used to generate the bias voltage 505, which is connected to the other terminal of inductor 504. The DC component of this voltage is the same as the DC voltage on node 503, both of which are determined by the desired bias condition of device 509. In most cases node 505 is an RF ground at the fundamental RF signal frequency. However, more generally, node 505 should have a low impedance to the source of transistor 509 at the fundamental RF frequency so that it forms a parallel LC tank with the input capacitance of device 509. The characteristics of node 505 at frequencies other than DC and the RF fundamental can be tailored to provide optimal efficiency in the overall system. For example, it may be desirable to have a baseband signal related to the RF signal amplitude present on node 505 to achieve amplitude dependent biasing of device 509. Or it may be desirable to have harmonics of the RF fundamental present on node 505 to improve the efficiency of device 502. In some embodiments block 506 could simply connect node 505 to a DC supply voltage. In other embodiments block 506 could contain an amplifier, which maintains a constant voltage on node 505 at baseband, and a capacitor from node 505 to ground, which maintains a constant voltage on node 505 at RF.

The drain of transistor 502 is connected to supply voltage 515. In most cases this node is a DC supply voltage at a DC offset relative to ground and with little or no AC voltage swing. However, more generally supply voltage 515 could also be any voltage, DC or time varying, that is higher than node 503 so that it provides current to the circuit. In embodiments where linear operation is desired one should also assure that supply voltage 515 is high enough that transistor 502 remains in its forward active region at all times. Although the figure shows supply 515 being shared by both preamplifier 513 and output amplifier 514, the supplies of these two stages are not required to be the same.

Figure 5B:
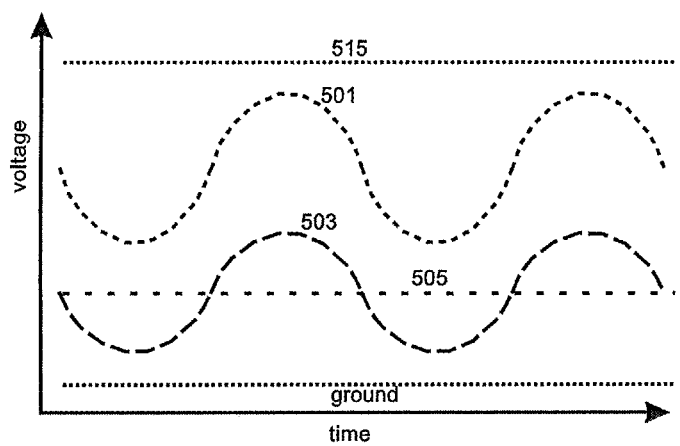

An example of waveforms present in the amplifier of (a) are shown in FIG. 5b. The RF nodes 501 and 503 are substantially in phase with one another, although small variations in the phase relationship of these nodes are to be expected due to the complex nature of the impedance connected to node 503. The amplitude of 503 is less than that of 501 because preamplifier 513 has a gain of less than unity. When device 502 is an NMOS transistor, the DC voltage of node 501 is higher than the DC voltage of node 503 so that device 502 is biased with continuous current. Supply node 515 has a DC voltage that is higher than the peak of node 501 minus a device threshold when linear amplification is desired. Bias node 505 has a DC voltage that is at the average of waveform 503.

There are several characteristics that differentiate the low impedance amplifier of embodiments of the present invention from prior art common-source RF amplifiers. Embodiments of the amplifier stage provide a voltage gain of less than unity, regardless of how it is biased, whereas common-source amplifier stages can and are usually biased so as to provide voltage gain greater than unity. In the amplifier stage of FIG. 5a, current flow through device 502 is determined predominantly by the gate-to-source voltage, the voltage difference from node 501 to node 503. Therefore, the output voltage, 503, directly controls current flow through the stage. In contrast, current flow through the active device of a common-source amplifier stage is insensitive to voltage on the stage's output node. The input and output waveforms of an amplifier stage of the present invention are substantially in phase with one another. In contrast, the input and output waveforms of a common-source amplifier of the prior art are substantially in phase opposition.

Figure 13:
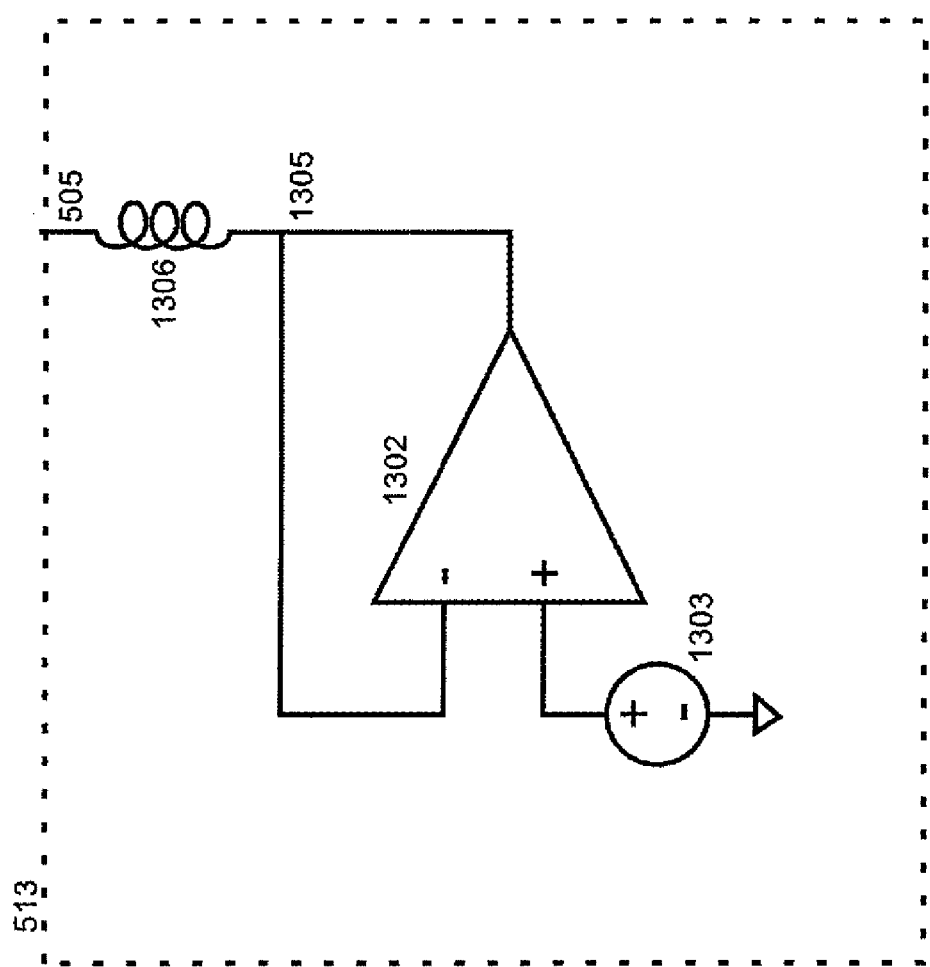
FIG. 13 shows one possible bias block circuit.

An example of an embodiment of bias block 506 is shown in FIG. 13. Choke 1306 is positioned in series with node 505 to keep RF currents, which are present on node 505, from entering the rest of the block. Reference 1303 defines the DC voltage that is placed on nodes 505 and 1305 since opamp 1302 is connected in a unity-gain configuration. The bandwidth of opamp 1302 determines the amplitude of baseband envelope signals on node 505.

Figure 6A:
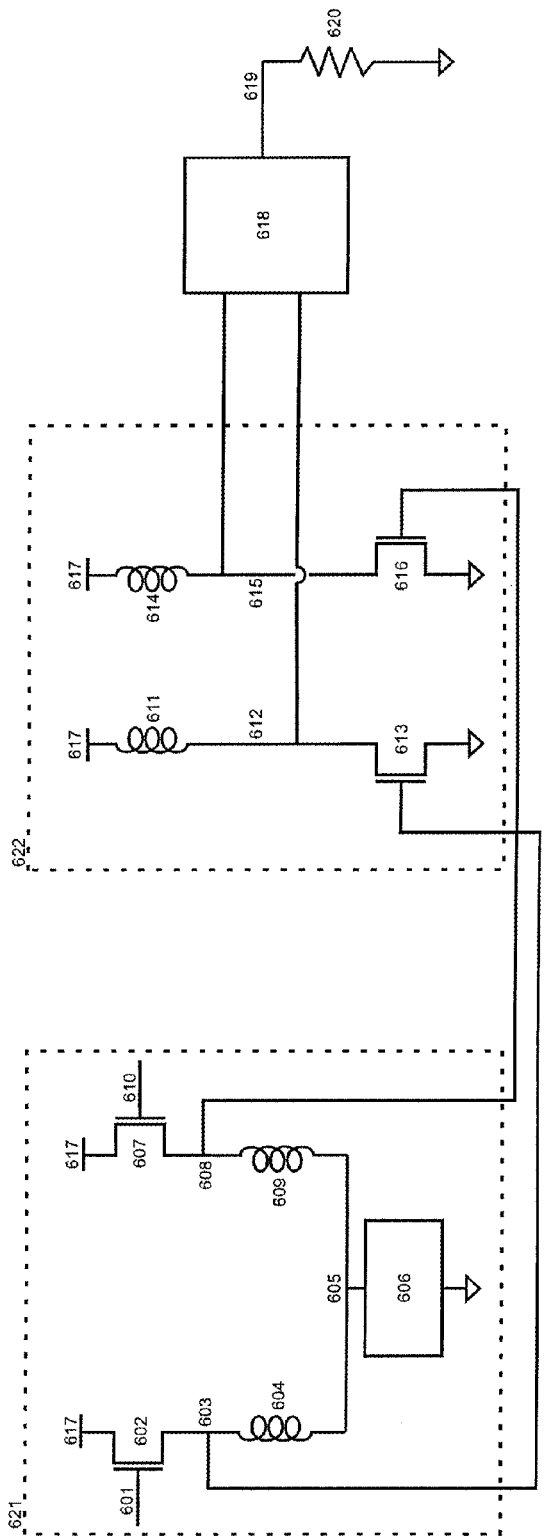
FIG. 6a illustrates a differential embodiment of the present invention, configured as a predriver.

The embodiment of FIG. 5a is single ended, but the present invention can also be built differentially, as in FIG. 6a, which shows an amplifier embodiment of the present invention configured as a differential preamplifier. A differential amplifier is used in cases where the output signals needed are differential. A differential amplifier also has advantages of its own. First, the requirements of bias block 606 and of supply node 617 are eased for a differential configuration because these blocks have less RF current. Second, a differential amplifier benefits from cancellation of even harmonics.

A differential amplifier 621 of the present invention includes a positive amplifier and a negative amplifier. The positive amplifier is formed from transistor 602 and inductor 604 and has a positive output 603. The negative amplifier is formed from transistor 607 and inductor 609 and has a negative output 608. This configuration provides a low impedance looking back into devices 602 and 607, and this low source impedance dampens any potential oscillations associated with output stage devices 613 and 616 and the tanks on their gates and drains.

The input capacitance of device 613 forms part of positive reactance connected to positive output 603. The input capacitance of device 616 forms part of negative reactance connected to negative output 608. The positive and negative reactive networks have currents and voltages that are out of phase with one another. As a result, current travels back and forth differentially between the two tanks. When the positive and negative amplifiers are balanced, the center node 605 is an RF virtual ground and bias block 606 does not need to carry much current at the RF fundamental. Block 606 is used to set the DC, common mode, level of the differential outputs 603 and 608 but does not need to have a bandwidth that extends to RF. Although the sources of transistors 613 and 616 are shown as being connected to ground, which is the same supply that block 606 is connected to, there is no requirement that these supplies be the same. Inductors 604 and 609 are generally connected together to a single node 605. However, in situations where different bias conditions are desired in devices 613 and 616, node 605 could be split into positive and negative bias nodes that would be separate outputs from bias block 606.

Supply voltage 617 provides mostly DC current to the positive and negative amplifiers. However, to the extent that the gain of each amplifier is less than unity, there will be an RF voltage from gate to source that produces current through devices 602 and 607 at the RF fundamental. This current is out of phase between the positive and negative amplifiers and, therefore, cancels. Although supply voltage 617 is shown as the supply for both amplifier 621 and output amplifier 622, there is no requirement that these supplies be the same.

Output amplifier, 622, includes a positive common-source amplifier and a negative common-source amplifier. The positive amplifier is formed from transistor 613 and inductor 611 and has a positive output node 612, and the negative amplifier is formed from transistor 616 and inductor 614 and has a negative output node 615. Differential outputs 612 and 615 are passed to an output network 618 that performs impedance transformation as well as differential-to-single-ended conversion.

Figure 6B:
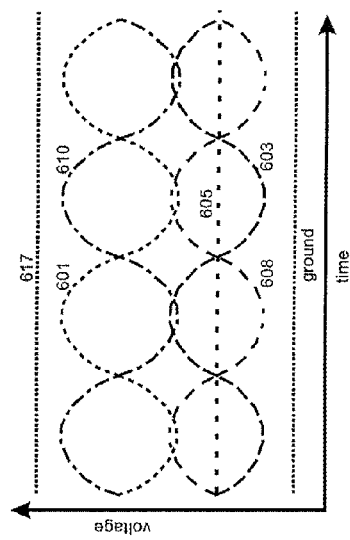

The waveforms for the embodiment of FIG. 6a are shown in FIG. 6b. Inputs 601 and 610 are in opposite differential phase, but at the same common mode level. Output 603 is in phase with input 601, and output 608 is in phase with input 610. The amplitudes of outputs 603 and 608 are less than those of inputs 601 and 610 because amplifier 621 has a gain of less than unity. Node 605 is a DC or baseband signal at the common-mode level of 603 and 608, and is set at an offset relative to ground that determines the DC current through transistors 613 and 616. In linear operation, supply node 617 is set higher than the peak voltage of nodes 601 and 610, minus a device threshold, so that transistors 602 and 607 remain in their forward active region at all times.

The differential amplifier of FIG. 6 can also be implemented using PMOS transistors as is shown in FIG. 7. This amplifier is similar to that of FIG. 6, but is flipped upside down. The low impedance amplifier embodiment of the present invention, 720, includes a positive amplifier with PMOS transistor 702 and inductor 704 and a negative amplifier with PMOS transistor 709 and inductor 707. The amplifier has positive output 703 and negative output 708 that drive the inputs of output amplifier stage 721. The voltage difference between input and output of each of the positive and negative amplifiers defines the current through that amplifier. Node 705 is an RF virtual ground with a common-mode voltage that sets the bias point of devices 711 and 714 in the output amplifier. Bias block 706 needs to set the desired voltage on node 705 at DC and baseband. The output amplifier stage, 721, in the figure is also shown as a PMOS variety, with active PMOS devices 711 and 714. However, PMOS amplifier 720 could also drive an NMOS version output amplifier, similar to that of 622 in FIG. 6, provided the DC levels are set appropriately or provided that a DC block is included between the two stages.

Figure 7A:
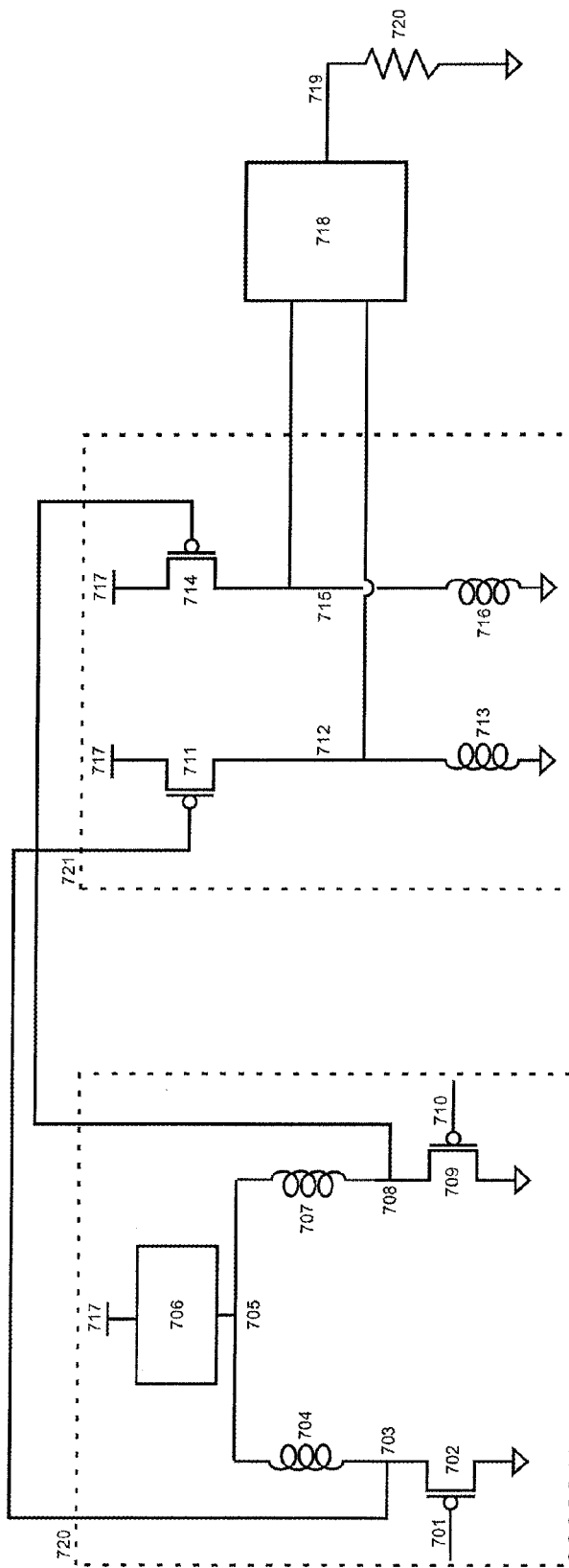
FIG. 7a illustrates a differential embodiment of the present invention, configured as a predriver, that uses PMOS transistors.
Figure 7B:
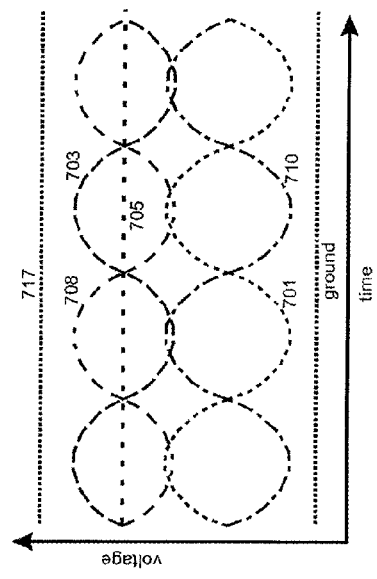

The waveforms corresponding to the embodiment of FIG. 7a can be seen in FIG. 7b. Nodes 701 and 703 are substantially in phase with one another, although with a DC offset, and node 710 and 708 are substantially in phase with one another with the same DC offset. Since active devices 702 and 709 are PMOS devices, the average voltage of input nodes 701 and 710 is lower than the average voltage of output nodes 703 and 708. The voltage on node 705 is lower than that of 717, which is the source of devices 711 and 714, and sets the bias current through output amplifier stage 721.

Figure 8:
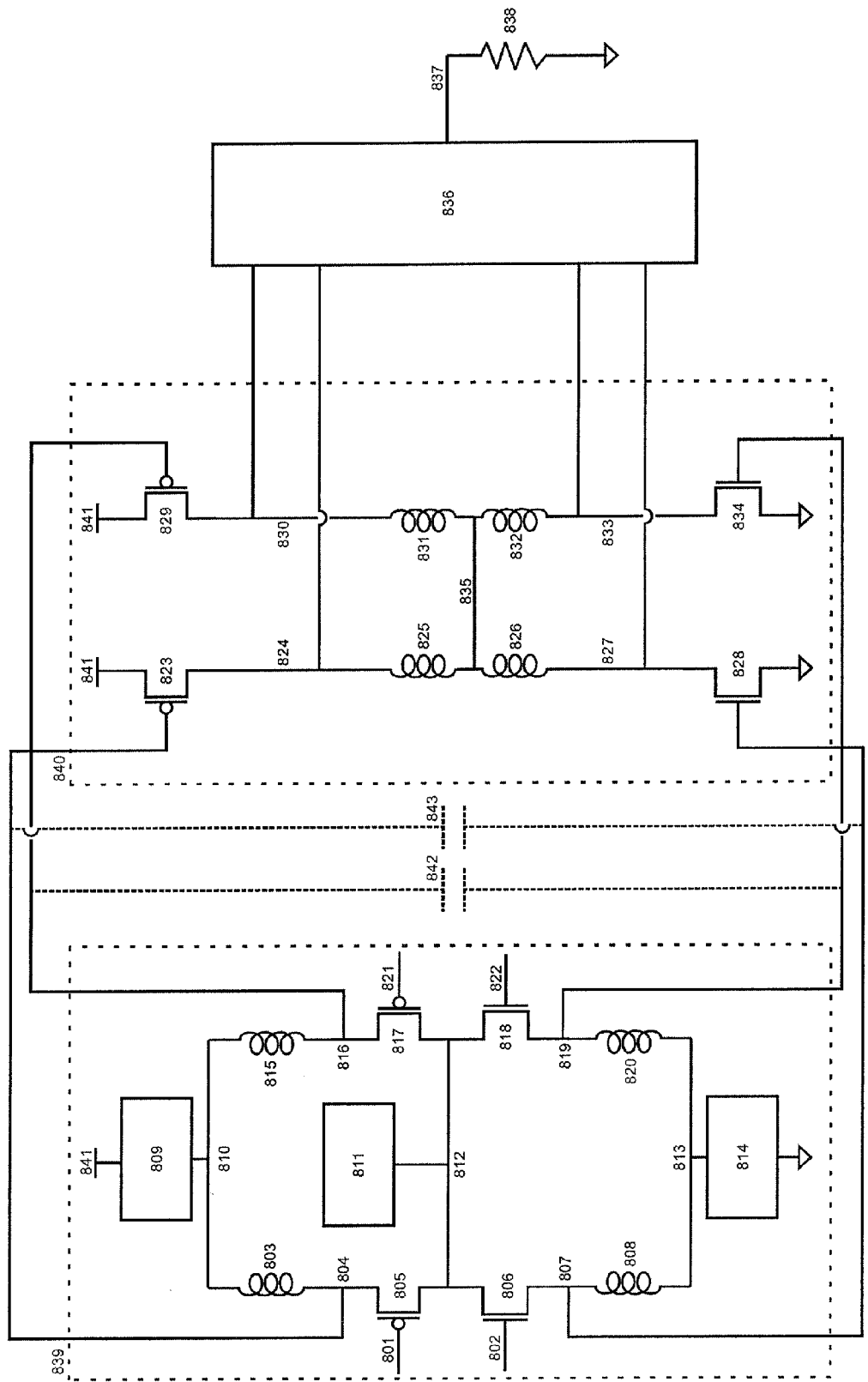
FIG. 8 illustrates a quad differential embodiment of the present invention, configured as a predriver.

A low impedance amplifier, according to an embodiment of the present invention, can also be implemented as quad differential as is shown in FIG. 8. Quad-differential amplifier, 839, is configured as a preamplifier. It is followed by quad-differential output amplifier 840, which provides quad-differential signals 827, 833, 824, and 830 to output network 836. Output network 836 includes a power combiner that allows two sets of differential inputs to be combined into one single-ended output 837.

Amplifier 839 includes the NMOS amplifier of FIG. 6 stacked below the PMOS amplifier of FIG. 7. The current of device 805 is set by the difference in gate-to-source voltage of nodes 801 and 804. The current of device 806 is set by the difference in voltage of nodes 802 and 807. The DC voltage of node 810 is set by the bias requirements of devices 823 and 829, and the DC voltage of node 813 is set by the bias requirements of devices 828 and 834. Nodes 813 and 810 might be DC voltages or alternatively, either or both of these nodes might have a baseband signal present as part of a broader biasing loop. Since both stacked amplifiers are differential, nodes 813 and 810 are virtual grounds, and bias blocks 814 and 809 do not need to have RF bandwidths. In some cases, it may be desirable to include inductive chokes at the inputs to blocks 814 and 809 to limit RF current from entering these blocks.

Within block 839, the bias current of the NMOS amplifiers is shared by that of the PMOS amplifiers. Supply node 812 is an intermediate supply that has a voltage in between that of 841 and ground. The voltage on node 812 is generated by bias block 811. In the case of linear operation node 812 should be positioned so that NMOS devices 806 and 818 and PMOS devices 805 and 817 all remain in their forward active regions. In the case of a nonlinear or saturated amplifier, this requirement does not apply, and node 812 should lie between the voltages of 813 and 810. In some cases, node 812 is a DC voltage and block 811 is an amplifier designed to maintain this voltage constant. In other cases, block 811 is absent and node 812 is set by the output impedances of the NMOS and PMOS amplifiers. In other cases, the low frequency voltage of node 812 is fed back to the bias of the amplifier inputs in a way that maintains voltage 812 at a desired reference. In some cases, node 812 is not shorted across the positive and negative sides so that the bias current through device 805 is identical to that through device 806 and the bias current through device 817 is identical to that through device 818 and current does not mix between the positive and negative sides.

Nodes 807 and 804 are generally in phase with one another and can be joined together at RF with optional capacitor 843 or by introducing magnetic coupling between inductors 808 and 803. Nodes 819 and 816 are generally in phase with one another and can be joined together at RF with optional capacitor 842 or by introducing magnetic coupling between inductors 820 and 815. In some embodiments, this is helpful to assure that these signals remain properly phase aligned despite imbalances and differences between the NMOS and PMOS signal paths.

Output amplifier 840 includes the NMOS common-source output amplifier of FIG. 6 stacked below the PMOS common-source output amplifier of FIG. 7. Although a quad-differential output amplifier is shown in the figure, other output amplifiers can be used as well. For example, the differential amplifier 622 of FIG. 6 or that of 721 of FIG. 7 or the single-ended amplifier of 514 in FIG. 5 could be used if a combining network is placed between the two stages.

Figure 9:
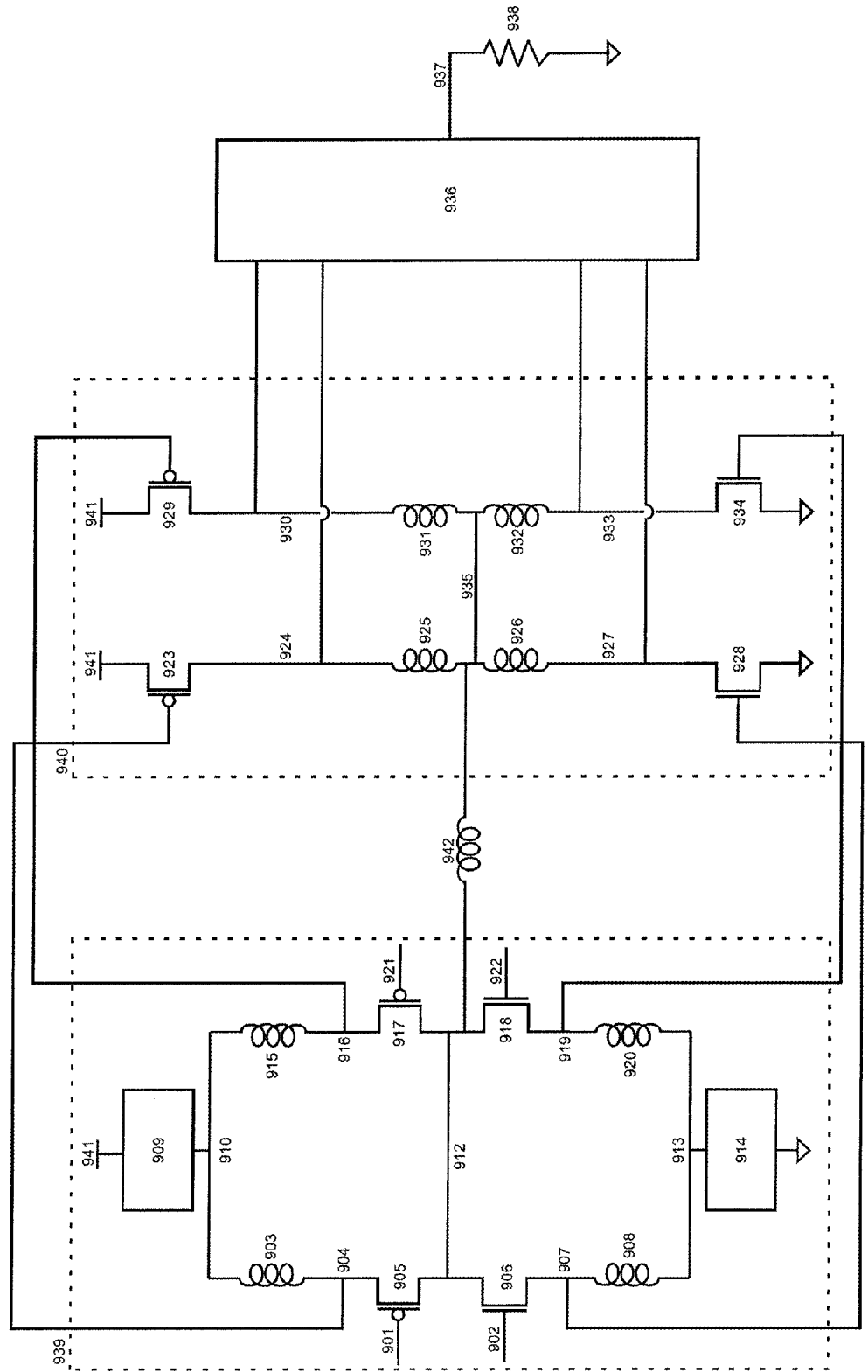
FIG. 9 shows a different embodiment of the amplifier shown in FIG. 8.

A slightly different version of the apparatus in FIG. 8 can be seen in FIG. 9. This version is appropriate when the voltage across the NMOS amplifiers of the preamplifier and output amplifier are similar and when the voltage across the PMOS amplifiers of the preamplifier and output amplifier are similar. Bias block 811 of FIG. 8 is removed and replaced by inductor 942 between the stages. In this configuration the output stage performs the function of bias block 811.

Figure 10:
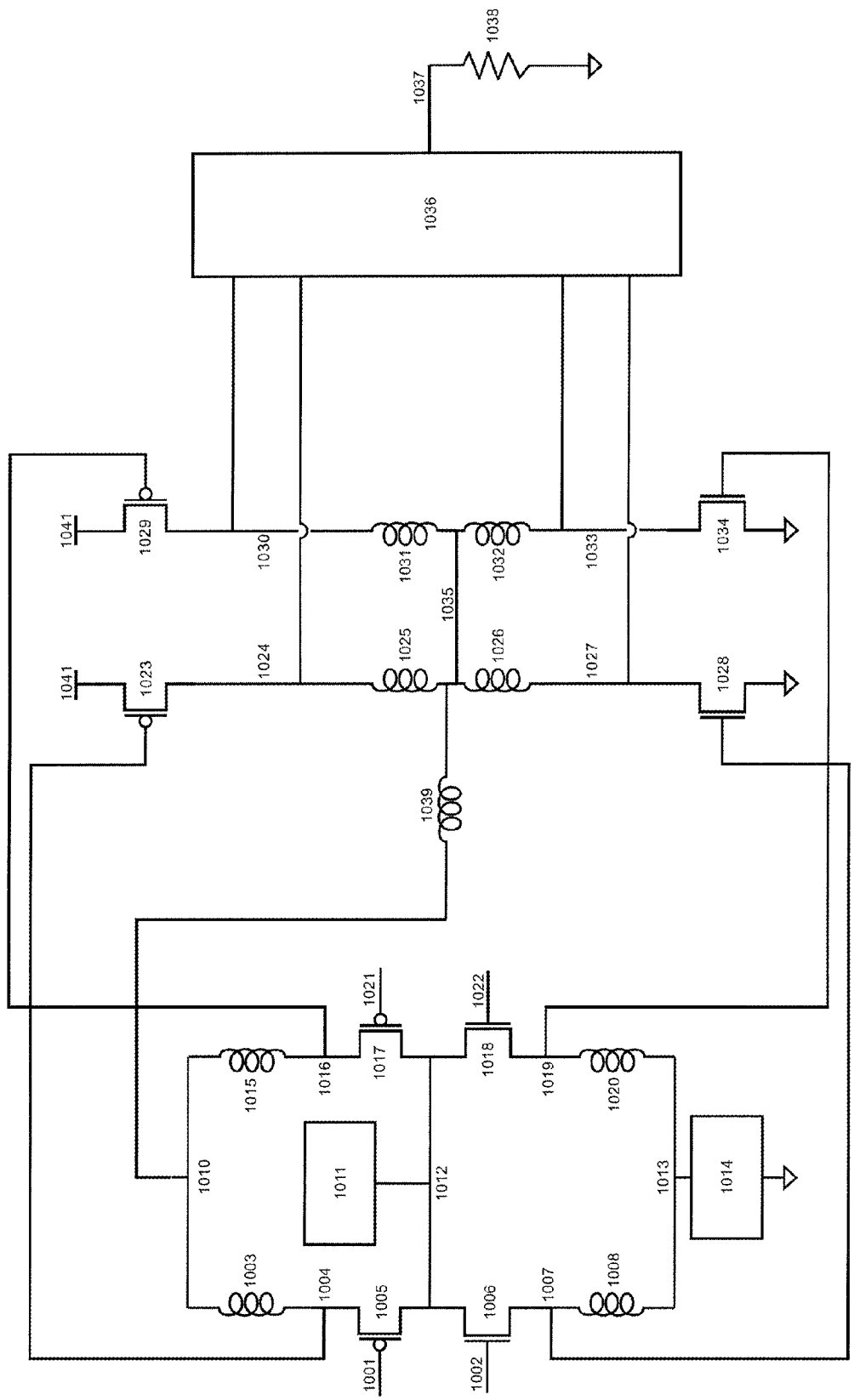
FIG. 10 shows a different embodiment of the amplifier shown in FIG. 8.

A second slightly different version of the apparatus in FIG. 8 can be seen in FIG. 10. This version differs in that bias block 809 of FIG. 8 has been removed and is replaced by inductor 1039. This configuration has the benefit that the DC voltage of nodes 1027, 1033, 1024, and 1030 is well controlled and set by feedback. PMOS devices 1023 and 1029 are diode connected at low frequency. In this configuration, bias 1013 is held at a DC level and the feedback through inductor 1039 sets the DC operating conditions.

Although FIG. 10 is shown with a DC bias on node 1013 and feedback to node 1010, the opposite flavor configuration is possible too. Node 1010 could be held at a constant bias by a bias block while node 1013 is connected to inductor 1039 and shorted to the output stage's outputs.

Figure 11:
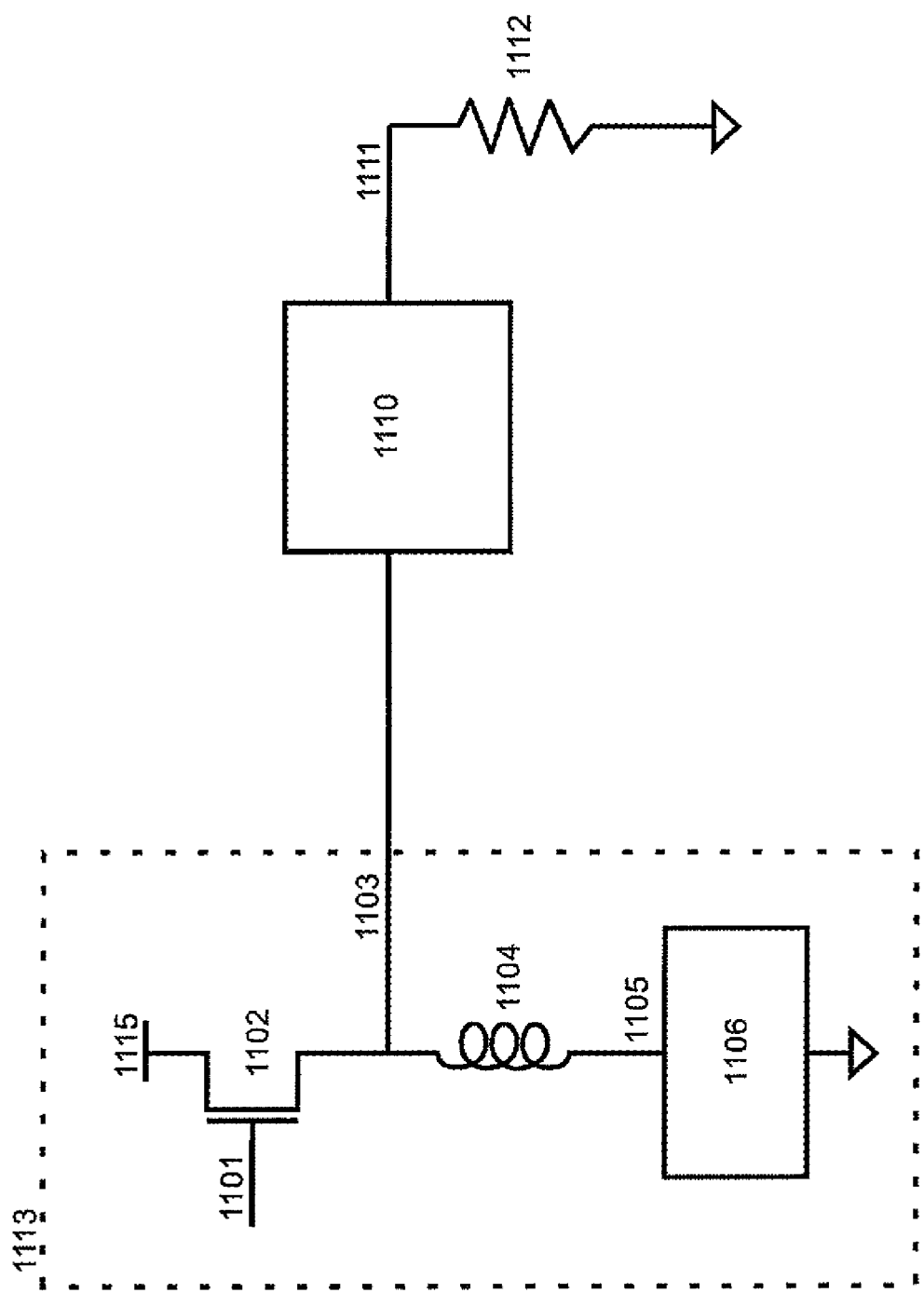
FIG. 11 shows a single ended embodiment of the present invention, configured as an output amplifier.

One application of embodiment of the prevent invention is as a power amplifier predriver. This usage was presented in FIGS. 5-10. Another application of the present invention is as a low impedance RF output amplifier, an embodiment of which is shown in FIG. 11. This usage is beneficial for systems with low load impedance or when large output voltage swings are not required. Low impedance amplifier 1113 generates RF output 1103, which is connected to output network 1110. Within amplifier 1113, NMOS transistor 1102 receives the RF input on its gate, has its drain connected to supply node 1115, and produces RF output 1103 on its source. Inductor 1104 is connected to RF output 1103 and to bias node 1105 and provides DC current to the amplifier. Inductor 1104 also acts as a resonant element, in conjunction with a larger reactive network, to boost the load seen by transistor 1102 and boost the voltage swing on node 1103. In one embodiment, the resonant reactive network includes only inductor 1104 and parasitic capacitance on node 1103. In this case, the output network 1110 is simply a short. In another embodiment, the resonant reactive network includes a combination of parasitic capacitance on node 1103 and reactive elements within network 1110. Although inductor 1104 is drawn as a simple inductor, it could be the primary winding of a transformer whose secondary is part of the output network. In yet another embodiment, bias block 1106 contains a short to ground so that node 1105 is grounded and bias current through device 1102 is set by the DC voltage on RF input 1101.

Figure 12:
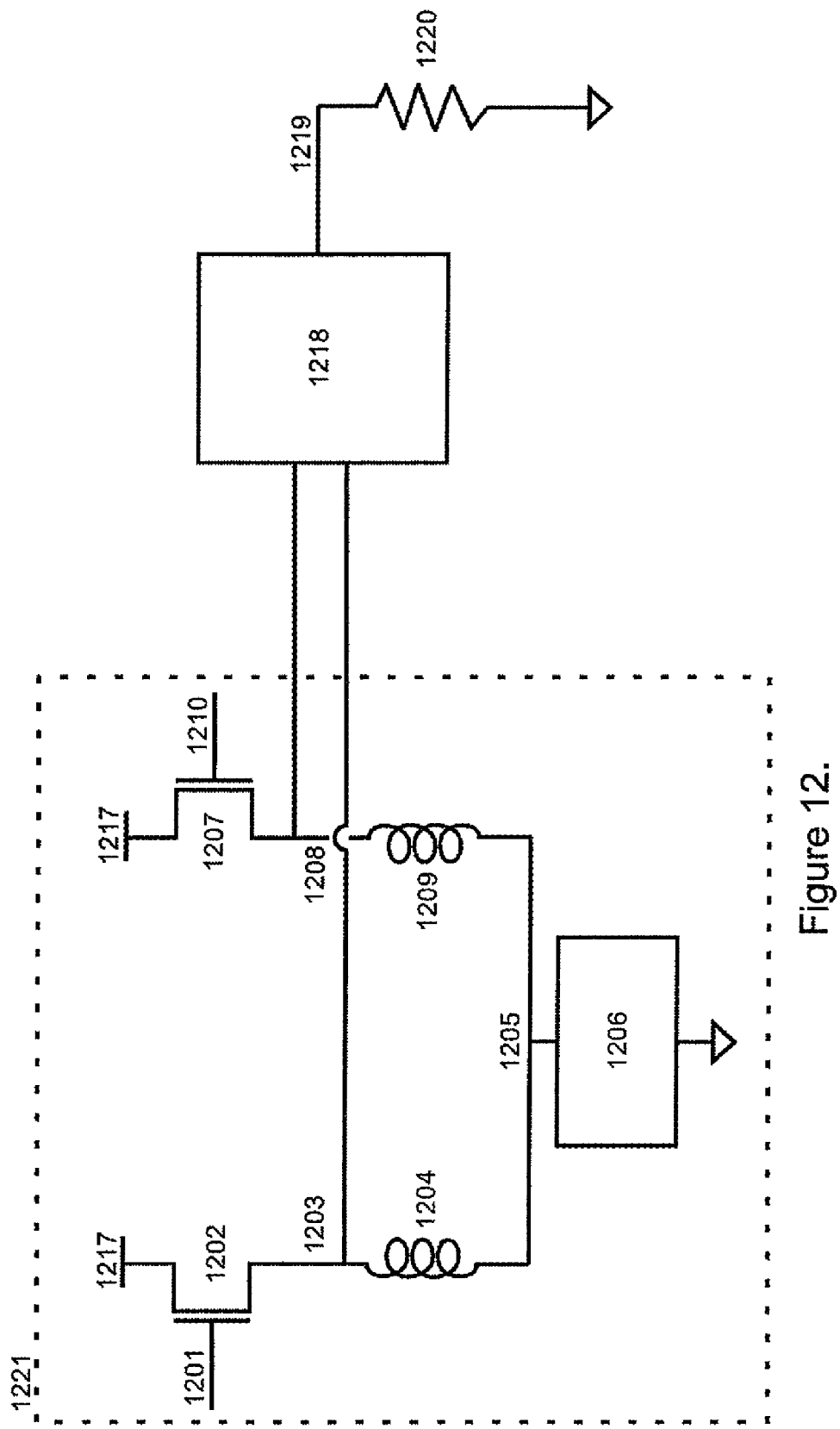
FIG. 12 shows a differential embodiment of the present invention, configured as an output amplifier.

A second apparatus utilizing a low impedance RF amplifier of the present invention as an output amplifier is shown in FIG. 12. Differential low impedance output amplifier 1221 has differential RF inputs 1201 and 1210 and differential RF outputs 1203 and 1208 connected to output network 1218. The positive amplifier includes transistor 1202 and inductor 1204 and the negative amplifier includes transistor 1207 and inductor 1209. In this application, bias block 1206 is generally absent and node 1205 is either connected to ground or connected through an inductor to ground. Although inductors 1204 and 1209 are shown in the figure as simple inductors, they could also be the primary winding of a transformer, whose secondary is part of the output network.

The description of the invention set forth herein is illustrative, and is not intended to limit the scope of the invention as set forth in the following claims. For example, although the RF power amplifier described herein is particularly well suited to power amplifiers built in CMOS, it could also be applied to power amplifiers built in other technologies such as GaAs, SiGe, SOI, and LDMOS. Variations and modifications of the embodiments disclosed herein may be made based on the description set forth herein without departing from the scope of the invention as set forth in the following claims.

What is claimed is:

1. An apparatus comprising:
a radio frequency (RF) power amplifier stage including,
a first transistor having a first terminal coupled to an amplifier RF input node, a second terminal coupled to an amplifier RF output node, wherein the second terminal is a source terminal of the first transistor, and a third terminal coupled to a supply voltage node;
a first inductor coupled between the RF output node and a bias voltage node;
wherein current through the first transistor is determined predominantly by a difference in voltage between the RF input node and the RF output node; and
wherein the first inductor is resonant with the reactance present on the RF output node.

2. The apparatus as recited in claim 1 wherein the voltages on the RF input node and the RF output node are substantially in phase with one another.

3. The apparatus as recited in claim 1 wherein the first transistor is a CMOS transistor.

4. The apparatus as recited in claim 1 wherein the supply voltage node is coupled to a system power supply.

5. The apparatus as recited in claim 1 wherein the first inductor forms the primary coil of a transformer.

6. The apparatus as recited in claim 1 wherein the bias voltage node is coupled to a system power supply.

7. The apparatus as recited in claim 1 further comprising a load network coupled to the RF output node, and wherein the load network is predominantly capacitive.

8. The apparatus as recited in claim 1 further comprising a load network coupled to the RF output node and wherein the load network comprises the input capacitance of a MOS transistor.

9. The apparatus as recited in claim 1 wherein the RF input node connects to the gate of the first transistor and the RF output node connects to the source of the first transistor and the current through the first transistor is predominantly determined by its gate-to-source voltage.

10. The apparatus as recited in claim 1 wherein the resonance between the first inductor and a load connected to the RF output node increases an impedance seen by the first transistor at RF.

11. The apparatus as recited in claim 1 further comprising a load network coupled to the RF output node and wherein the load network comprises input capacitance of an output RF power amplifier stage.

12. The apparatus as recited in claim 1 further comprising a load network coupled to the RF output node and wherein the load network comprises input capacitance of a common-source amplifier.

13. The apparatus as recited in claim 1 further comprising a bias block coupled to the bias voltage node to maintain voltage on the bias voltage node at a desired level.

14. The apparatus as recited in claim 1 further comprising a bias block connected to said supply voltage node to maintain the voltage on the supply voltage node at a desired level.

15. The apparatus as recited in claim 13 wherein the bias block maintains the bias voltage at a constant DC level.

16. The apparatus as recited in claim 13 wherein the voltage on the bias voltage node contains a baseband signal component.

17. The apparatus as recited in claim 13 wherein the voltage on the bias voltage node is controlled by feedback.

18. An apparatus comprising:
a differential radio frequency (RF) power amplifier stage including,
a positive transistor having a first terminal coupled to an amplifier positive RF input node, a second terminal coupled to an amplifier positive RF output node, wherein the second terminal of the positive transistor is a source terminal of the positive transistor, and a third terminal coupled to a positive supply voltage node;
a negative transistor having a first terminal coupled to an amplifier negative RF input node, a second terminal coupled to an amplifier negative RF output node wherein the second terminal of the negative transistor is a source terminal of the negative transistor, and a third terminal coupled to a negative supply voltage node;
a positive inductor coupled between the positive RF output node and a positive bias voltage node;
a negative inductor coupled between the negative RF output node and a negative bias voltage node;
wherein current through the positive transistor is determined predominantly by a difference in voltage between the positive RF input node and the positive RF output node;
wherein current through the negative transistor is determined predominantly by a difference in voltage between the negative RF input node and the negative RF output node;
wherein the positive inductor is resonant with a reactance present on the positive RF output node, and
wherein the negative inductor is resonant with a reactance present on the negative RF output node.

19. The apparatus as recited in claim 18 wherein the voltages on the positive RF input node and the positive RF output node are substantially in phase with one another and wherein the voltages on the negative RF input node and the negative RF output node are substantially in phase with one another.

20. The apparatus as recited in claim 18 wherein the positive and negative transistors are CMOS transistors.

21. The apparatus as recited in claim 18 wherein the positive and negative supply voltage nodes are the same node.

22. The apparatus as recited in claim 18 wherein the positive and negative inductors form the primary coil of a transformer.

23. The apparatus as recited in claim 18 wherein the positive and negative bias voltage nodes are the same node.

24. The apparatus as recited in claim 18 wherein positive and negative load networks coupled to the positive and negative RF output nodes are predominantly capacitive.

25. The apparatus as recited in claim 18 further comprising:
a positive load network coupled to the positive RF output node;

a negative load network coupled to the negative RF output node; and wherein the positive and negative load networks comprise input capacitances of positive and negative MOS transistors.

26. The apparatus as recited in claim 18 further comprising:
a positive load network coupled to the positive RF output node;
a negative load network coupled to the negative RF output node; and
wherein the positive and negative load networks comprise input capacitances of positive and negative inputs to an output RF power amplifier stage.

27. The apparatus as recited in claim 18 further comprising a bias block coupled to the bias voltage node to maintain a bias voltage on the bias voltage node at a desired level.

28. The apparatus as recited in claim 18 further comprising a bias block connected to said supply voltage node to maintain a bias voltage on the supply voltage node at a desired level.

29. The apparatus as recited in claim 27 wherein the bias block maintains the bias voltage at a constant DC level.

30. The apparatus as recited in claim 27 wherein the voltage on the bias voltage node contains a baseband signal component.

31. The apparatus as recited in claim 27 wherein the voltage on the bias voltage node is controlled by feedback.

32. A method for operating a low impedance amplifier comprising:
receiving an RF signal at a control terminal of a transistor;
receiving a supply voltage at a first current carrying terminal of the transistor;
supplying an RF output signal from a second current carrying terminal of the transistor to an RF output node, the second current carrying terminal being a source terminal of the transistor;
achieving a higher load impedance seen by the transistor at RF frequencies by resonating an inductor coupled to the RF output node with reactance present on the RF output node; and
determining current through the transistor according to a difference in voltage between the control terminal and the RF output node.

* * * * *